(12) United States Patent
Hamada et al.

(10) Patent No.: US 6,921,590 B2
(45) Date of Patent: Jul. 26, 2005

(54) ORGANIC ELECTROLUMINESCENT DEVICE

(75) Inventors: Yuji Hamada, Nara (JP); Noriyuki Matsusue, Hirakata (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 10/252,014

(22) Filed: Sep. 23, 2002

(65) Prior Publication Data

US 2003/0108770 A1 Jun. 12, 2003

(30) Foreign Application Priority Data

Sep. 25, 2001 (JP) ........................................ 2001-292500

(51) Int. Cl.$^7$ ............................................. H05B 33/12
(52) U.S. Cl. ....................... 428/690; 428/917; 313/504; 313/506
(58) Field of Search ................ 428/690, 917; 313/504, 506

(56) References Cited

U.S. PATENT DOCUMENTS 6,602,618 B2 * 8/2003 Watanabe et al. ........... 428/690

FOREIGN PATENT DOCUMENTS

| JP | 2000-188184 | * | 7/2000 |
| JP | 2001-085166 | * | 3/2001 |

OTHER PUBLICATIONS

Hamada, Yuji et al., Applied Physics Letters, vol. 72, No. 16, Apr. 20, 1998, pp. 1939–1941.*

* cited by examiner

Primary Examiner—Dawn Garrett
(74) Attorney, Agent, or Firm—Armstrong, Kratz, Quintos, Hanson & Brooks, LLP

(57) ABSTRACT

In an organic EL device, a hole injection electrode is formed on a glass substrate, and a hole transport layer, a luminescent layer, a hole blocking layer, an electron transport layer, and an electron injection electrode are formed in this order on the glass substrate. The hole blocking layer includes a ternary complex compound including two quinolinol derivatives, a group IIIB element, and a halogen element or a phenol derivative.

2 Claims, 1 Drawing Sheet

F I G. 1
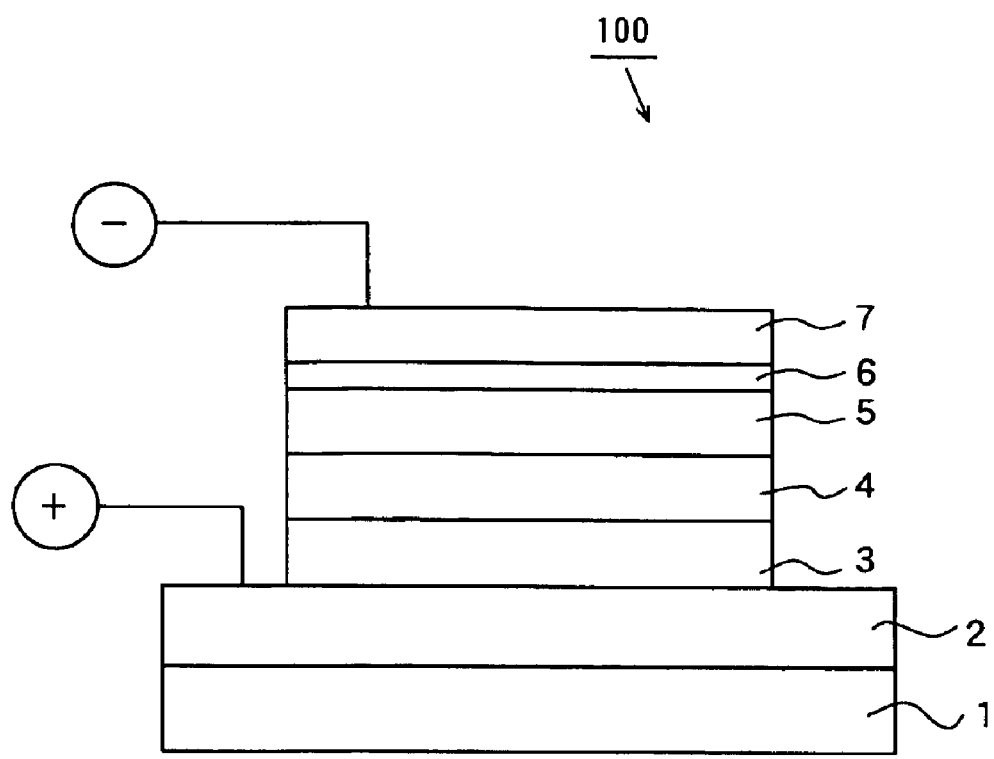

ORGANIC ELECTROLUMINESCENT DEVICE

BACKGROUND OF THE INVENTION

1. Field of the Invention

The present invention relates to organic electroluminescent devices.

2. Description of the Background Art

Organic electroluminescence devices (hereinafter referred to as organic EL devices) are expected as new self-light emitting devices. An organic EL device has a stacked layered structure that a carrier transport layer (an electron transport layer or a hole transport layer) and a luminescent layer are formed between a hole injection electrode and an electron injection electrode.

Electrode materials having a large work function such as gold or ITO (indium-tin oxide) are employed for the hole injection electrode, while those having a small work function such as Mg (magnesium) or Li (lithium) are employed for the electron injection electrode.

Organic materials are employed for the hole transport layer, the luminescent layer and the electron transport layer. Materials having the property of a p-type semiconductor are employed for the hole transport layer, while those having the property of an n-type semiconductor are employed for the electron transport layer. The luminescent layer is also composed of organic materials that have carrier transportability such as electron transportability or hole transportability and emit fluorescence or phosphorescence.

These hole injection electrode, hole transport layer, luminescent layer, electron transport layer and electron injection electrode are stacked in turn to form the organic EL device.

Each function layer such as the hole transport layer, the electron transport layer and the luminescent layer is constituted by a plurality of layers or omitted depending on the organic materials to be used.

In such an elementary structure as shown in *Appl. Phys. Lett.*, Vol. 55, pp. 1489–1491 by Chihaya Adachi et al., for example, only two organic layers, which are a luminescent layer and an electron transport layer exist between a hole injection electrode and an electron injection electrode. This is because the luminescent layer composed of luminescent materials called NSD has excellent hole transportability and hence serves also as a hole transport layer.

Further, the elementary structure shown in *Appl. Phys. Lett.*, Vol. 51, pp. 913–915 (1987) by C. W. Tang et al. is constituted by two organic layers, which are a hole transport layer and a luminescent layer. In this case, tris(8-hydroxyquinolinato)aluminum (hereinafter referred to as Alq) contained in the luminescent layer serves to both emit light and transport electrons.

On the other hand, the elementary structure shown in *Appl. Phys. Lett.*, Vol. 69, pp. 2160–2162(1996) by S. A. Van Slyke et al. is constituted by three organic layers, which are a hole injection layer, a hole transport layer and a luminescent layer. In this case, the hole injection layer is composed of copper phthalocyanine, serving for the same function as the hole transport layer, which results in two hole transport layers existing in the entire device.

Thus, the number of the electron transport layer, hole transport layer and luminescent layer can freely be adjusted depending on the organic materials to be used.

A triplet luminescent material is considered as a promising material for a luminescent layer having high luminescent efficiency. The triplet luminescent material transits from a triplet excited state to a ground state to generate phosphorescence. An organic EL device including a luminescent layer of a triplet luminescent material has a device structure as follows.

A hole injection electrode (anode), a hole transport layer, a luminescent layer, a hole blocking layer, an electron transport layer and an electron injection electrode (cathode) are stacked in this order on a glass substrate. The luminescent layer includes 4,4'-bis(carbazol-9-yl)-biphenyl (hereinafter referred to as "CBP") as a host material, and a triplet luminescent material as a luminescent dopant.

In this device structure, the hole blocking layer is used to prevent the electron transport layer from emitting light. More specifically, electrons are injected from the electron injection electrode into the electron transport layer, passed through the hole blocking layer, then injected into the luminescent layer and recombined with holes. Meanwhile, holes are injected from the hole injection electrode, passed through the hole transport layer, then injected into the luminescent layer, and recombined with electrons. In order to improve the recombination probability between holes and electrons in the luminescent layer, the holes must be prevented from penetrating through the hole blocking layer and being injected into the electron transport layer. Therefore, a highly stable hole blocking material having a high hole blocking characteristic is necessary as a material for the hole blocking layer.

As a conventional example, the use of Bathocuproine (hereinafter referred to as "BCP") as a hole blocking material is suggested in M. A. Baldo, et al., *Appl. Phys. Lett.*, 75. 4, 1999. The material has a molecular structure expressed by the following formula (6). Note that the formal name of BCP is 2,9-dimethyl-4,7-diphenyl-1, 10-phenanthroline.

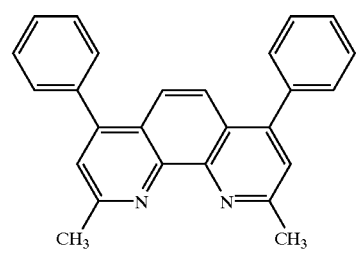

(6)

The BCP is however prone to crystallization with time after it is formed into a film. Therefore, the organic EL device produced using the BCP tends to suffer from current leakage, and stable light emission is not provided.

SUMMARY OF THE INVENTION

It is an object of the present invention to provide an organic electroluminescent device capable of stably emitting light with high luminance and high luminescent efficiency.

An organic electroluminescent device according to one aspect of the present invention comprises a hole injection electrode, a luminescent layer, a hole blocking layer, and an electron injection electrode in this order. The hole blocking layer includes a ternary complex compound composed of two quinolinol derivatives, a group IIIB element, and a halogen element or a phenol derivative.

In the organic electroluminescent device according to the invention, the hole blocking layer includes a ternary complex compound composed of two quinolinol derivatives, a group IIIB element, and a halogen element or a phenol derivative.

The presence of the hole blocking layer increases the energy barrier between the luminescent layer and the hole blocking layer. Therefore, holes can be prevented from being injected into the electron injection electrode side from the luminescent layer, so that electrons and holes can efficiently be recombined in the luminescent layer. Thus, the luminance and the luminescent efficiency of the organic electroluminescent device can be improved.

Since the above ternary complex compound is stable, the organic electroluminescent device can stably emit light.

The ternary complex compound may have a molecular structure represented by the following formula (1) where R1 and R2 may be identical to or different from one another each representing a hydrogen atom or a substituent, A may be a halogen element or phenol, and M may be a group IIIB element.

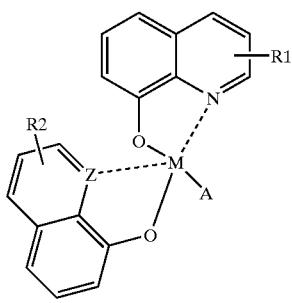

(1)

The group IIIB element may be gallium, indium or aluminum. This permits light to be more stably emitted.

The ternary complex compound may be bis-(2-methyl-8-quinolinolato)-chloro-gallium (hereinafter referred to as "GaMq2Cl") having a molecular structure represented by the following formula (2):

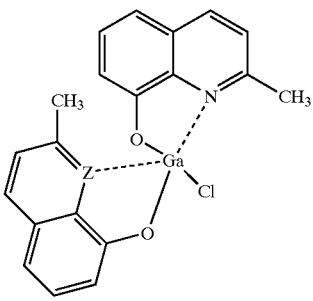

(2)

The ternary complex compound may be bis-(2-methyl-8-quinolinolato)-chloro-indium (hereinafter referred to as "InMq2Cl") having a molecular structure represented by the following formula (3):

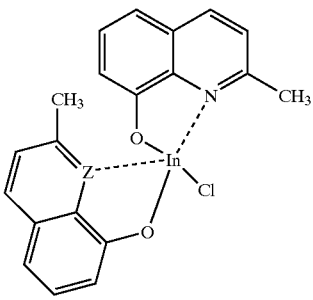

(3)

The ternary complex compound may be bis-(2-methyl-8-quinolinolato)-phenolato-aluminum (hereinafter referred to as "PhOAlq") having a molecular structure represented by the following formula (4):

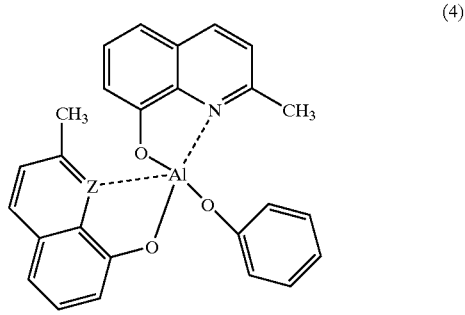

(4)

The ternary complex compound may be bis-(2-methyl-8-quinolinolato)-4-(tert-butyl-phenolato)-aluminum (hereinafter referred to as "tBuPhOAlq") having a molecular structure represented by the following formula (5):

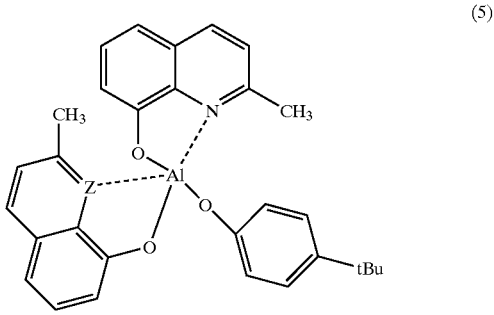

(5)

Preferably, the organic electroluminescent device further includes an electron transport layer provided between the hole blocking layer and the electron injection electrode, and the hole blocking layer has greater ionization potential than that of the electron transport layer.

In this way, holes can be prevented from being injected into the electron transport layer from the luminescent layer, so that electrons and holes can efficiently be recombined at the luminescent layer. Therefore, the luminescent efficiency of the organic electroluminescent device can be improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic diagram of an organic EL device according to one embodiment of the present invention.

DESCRIPTION OF THE PREFERRED EMBODIMENTS

FIG. 1 is a schematic diagram of an organic electroluminescent device (hereinafter referred to as "organic EL device") according to an embodiment of the present invention.

As shown in FIG. 1, in an organic EL device 100, a hole injection electrode (anode) 2 composed of a transparent electrode film is formed on a glass substrate 1. A hole transport layer 3 of an organic material and a luminescent layer 4 composed of an organic material are formed in this order on the hole injection electrode 2. A hole blocking layer 5 composed of an organic material is formed on the luminescent layer 4, an electron transport layer 6 is formed on the hole blocking layer 5, and an electron injection electrode (cathode) 7 is formed thereon.

The hole blocking layer 5 includes a ternary complex compound composed of two quinolinol derivatives, a group IIIB element, and a halogen element or a phenol derivative. The hole blocking layer 5 has ionization potential greater than that of the electron transport layer 6.

The ternary complex compound has a molecular structure represented by the following formula (1):

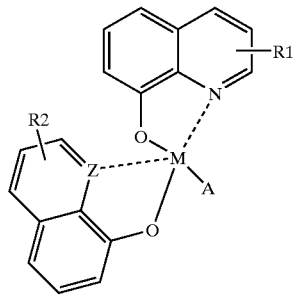

(1)

In the above formula (1), R1 and R2 may be identical to or different from one another each representing a hydrogen atom or a substituent, A represents a halogen element or a phenol derivative, and M represents a group IIIB element.

For example, R1 and R2 are —$C_nH_{2n+1}$(n=0 to 5), —CN, —Cl, —Br, —$OCH_3$, —$OC_2H_5$, —$N(CH_3)_2$, —$N(C_2H_5)_2$, a phenyl group, or a thiophene group.

In the above formula (1), M represents gallium (Ga), indium (In), aluminum (Al) or the like.

The ternary complex compound represented by the above formula (1) is manufactured by reacting a quinolinol derivative, a group IIIB element compound, and a halogen element or a phenol derivative to coordinate or chelate the quinolinol derivative and the halogen element or the phenol derivative with the group IIIB element. In this case, 1.5 to 2.5 mole of the quinolinol derivative and 0.5 to 1.5 mole of the halogen element or the phenol derivative are reacted with 1 mole of the group IIIB element compound. As the group IIIB element compond, a chloride of Al, Ga or In or the like can be used.

In particular, the above ternary complex compound is preferably GaMq2Cl having a molecular structure represented by the following formula (2):

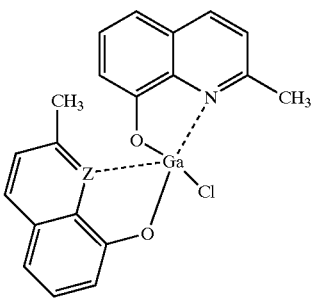

(2)

The above ternary complex compound may be InMq2Cl having a molecular structure represented by the following formula (3):

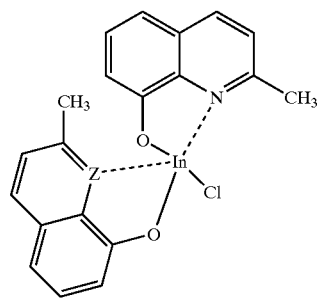

(3)

The above ternary complex compound may also be PhOAlq having a molecular structure represented by the following formula (4):

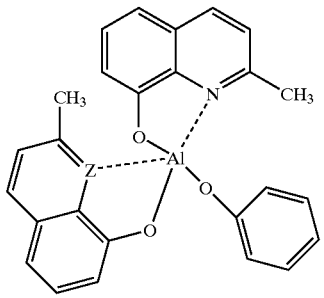

(4)

The above ternary complex compound may also be tBu-PhOAlq having a molecular structure represented by the following formula (5):

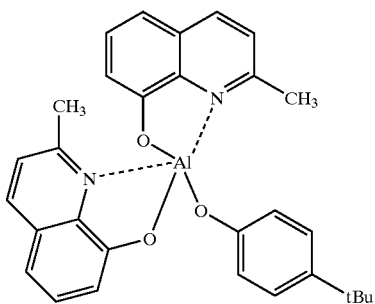

(5)

In the above described organic EL device 100, voltage is applied across the hole injection electrode 2 and the electron injection electrode 7, which causes the luminescent layer 4 to generate light, and the light is emitted from the back surface of the glass substrate 1.

In the organic EL device according to the embodiment, the hole blocking layer 5 includes a ternary complex compound composed of two quinolinol derivatives, a group IIIB element, and a halogen element or a phenol derivative.

The presence of the hole blocking layer 5 increases the energy barrier between the luminescent layer 4 and the hole blocking layer 5. Therefore, holes can be prevented from being injected into the electron transport layer 6 on the side of the electron injection electrode 7 from the luminescent layer 4, so that electrons and holes can efficiently be recombined at the luminescent layer 4. In this way, the luminance and luminescent efficiency of the organic EL device can be improved.

Since the above ternary complex compound is stable, the organic EL device can stably emit light.

Note that the organic EL device according to the invention is not limited to the above structure, and various other structures can be employed. For example, there may be three layers, i.e., a luminescent layer 4, a hole blocking layer 5 and an electron transport layer 6 between the hole injection electrode 2 and the electron injection electrode 7.

EXAMPLES

Organic EL devices according to Inventive Examples 1 to 4 and Comparative Example 1 were manufactured and measured for their luminescent characteristics.

Inventive Examples 1 to 4

In Inventive Examples 1 to 4, such an organic EL device was used that a hole injection electrode (anode) 2, a hole transport layer 3, a luminescent layer 4, a hole blocking layer 5, an electron transport layer 6 and an electron injection electrode (cathode) 7 was stacked in this order on a glass substrate 1.

In this case, the hole injection electrode 2 in the organic EL device is as thick as 1000 Å and composed of indium-tin oxide (ITO). The hole transport layer 3 is as thick as 500 Å and composed of N,N'-di(naphthalen-1-yl)-N,N'-diphenyl-benzidine) (hereinafter referred to as "NPB") having a molecular structure represented by the following formula (7):

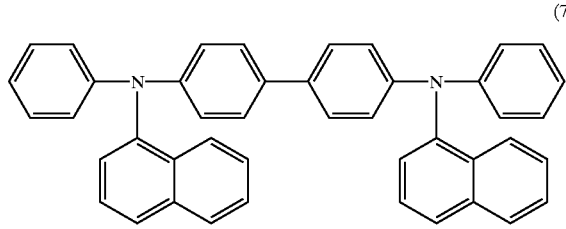

(7)

The luminescent layer 4 is as thick as 100 Å and it contains 4,4'-bis(carbazol-9-yl)-biphenyl (hereinafter referred to as "CBP") having a molecular structure represented by the following formula (8) as a host material and tris(2-phenylpyridine)iridium (hereinafter referred to as "Ir(ppy)3") having a molecular structure represented by the following formula (9) as a luminescent dopant.

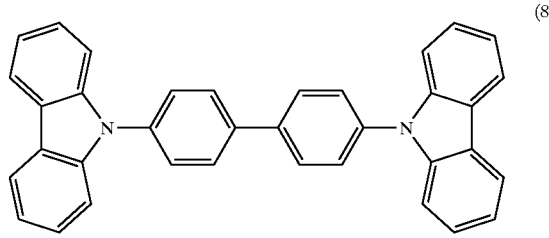

(8)

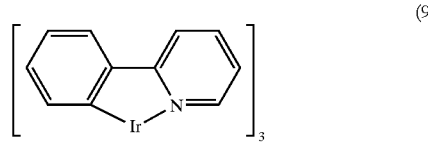

(9)

Note that in this case, the luminescent layer 4 includes 6 wt % Ir(ppy)3 relative to the CBP as the host material. The ionization potential of the CBP as the host material is 5.9 eV.

The hole blocking layer 5 is as thick as 100 Å and composed of a ternary complex compound having a molecular structure represented by the formula (1). In Inventive Example 1, as a material for the hole blocking layer 5, GaMq2Cl having a molecular structure represented by the formula (2) was used. In Inventive Example 2, as a material for the hole blocking layer 5, InMq2Cl having a molecular structure represented by the formula (3) was used. In Inventive Example 3, as a material for the hole blocking layer 5, PhOAlq having a molecular structure represented by the formula (4) was used. In Inventive Example 4, as a material for the hole blocking layer 5, tBuPhOAlq having a molecular structure represented by the formula (5) was used.

The electron transport layer 6 is as thick as 200 Å, and composed of tris (8-hydroxyquinolinato) aluminum (hereinafter referred to as "Alq") having a molecular structure represented by the following formula (10). The ionization potential of the electron transport layer 6 of the Alq is 5.5 eV.

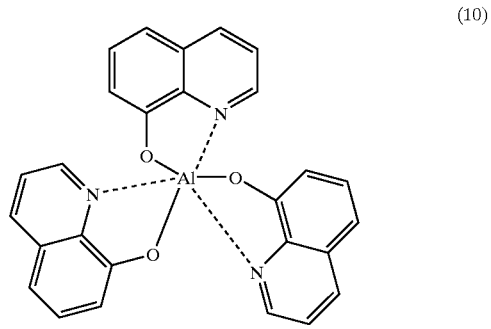

(10)

The electron injection electrode 7 is composed of a MgIn alloy (in the ratio of 10:1) having a thickness of 2000 Å.

The organic EL devices having the above structure were manufactured by the following method.

A hole injection electrode 2 made of indium-tin oxide (ITO) was formed on a glass substrate 1. Then, the glass substrate 1 thus having the hole injection electrode 2 thereon was cleaned with a neutral detergent and was then subjected to ultrasonic-cleaning in acetone for 10 minutes and in ethanol for 10 minutes. The surface of the glass substrate 1 was then further cleaned using an ozone cleaner.

Then, a hole transport layer 3, a luminescent layer 4, a hole blocking layer 5, an electron transport layer 6 and an electron injection electrode 7 were formed in this order on the hole injection electrode 2 of ITO by vacuum vapor deposition. They were all deposited at ordinary temperature at a vacuum degree of $1 \times 10^{-6}$ Torr without controlling the substrate temperature.

Comparative Example

The organic EL device according to Comparative Example 1 has the same structure as those of the organic EL devices according to Inventive Examples 1 to 4 except that BCP having a molecular structure represented by the formula (6) is used as a material for the hole blocking layer 5. The organic EL device according to Comparative Example 1 was manufactured by the same method as that for manufacturing the organic EL devices according to Embodiments 1 to 4.

Evaluation

The organic EL devices according to Inventive Examples 1 to 4 and Comparative Example 1 were measured for the luminescent characteristics and tested for the luminescence in continuous use with constant current. In the test, the organic EL devices were driven with DC current while the initial luminance was set to 500 cd/cm$^2$, and the retention rate of the initial luminance of 500 cd/cm$^2$ after 300 hours was measured.

The measured results about the luminescent efficiency, the luminescent wavelength, the maximum luminance and the retention rate of the initial luminance of 500 cd/cm$^2$ are given in Table 1.

TABLE 1

| | material for hole blocking layer | luminescent efficiency (cd/A) at 10 mA/cm² | luminescent wavelength (nm) | maximum luminance (cd/m²) | retention rate of initial luminance 500 cd/m² after 300 hours |
|---|---|---|---|---|---|
| Inventive example 1 | GaMq2Cl | 20.0 | 540 | 35,700 | 66% |
| Inventive example 2 | InMq2Cl | 17.0 | 541 | 21,000 | 50% |
| Inventive example 3 | PhOAlq | 25.0 | 540 | 45,000 | 70% |
| Inventive example 4 | tBuPhOAlq | 26.0 | 540 | 46,000 | 72% |
| Comparative example 1 | BCP | 19.0 | 541 | 30,100 | 35% |

As shown in Table 1, the organic EL devices according to Inventive Examples 1, 3, and 4 showed higher luminescent efficiency and greater maximum luminance than the organic EL device according to Comparative Example 1. Based on the result of the constant current continuos luminescence test, it was found that the organic EL devices according to Inventive Examples 1 to 4 each provided a retention rate of the initial luminance higher than that of the organic EL device according to Comparative Example 1, and the luminescence was stable. This is probably because in the organic EL devices according to Inventive Examples 1 to 4, the ternary complex compound used as a material for the hole blocking layer 5 was stabler after the film was formed than the BCP used as a material for the hole blocking layer in Comparative Example 1.

As in the foregoing and as can be understood from the results by Inventive Examples 1 to 4 and Comparative Example 1, using the ternary complex compound as a material for the hole blocking layer 5, an organic EL device capable of stably emitting light with high luminance and high luminescent efficiency can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An organic electroluminescent device, comprising in the following order:

a hole injection electrode;

a luminescent layer;

a hole blocking layer; and an electron injection electrode, said hole blocking layer including a ternary complex compound which is a bis-(2-methyl-8-quinolinolato)-chloro-gallium having a molecular structure represented by the following formula (2):

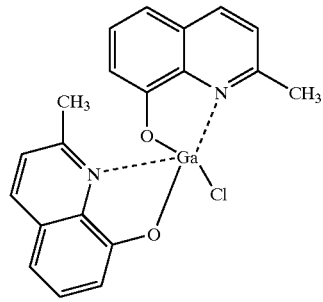

(2)

and further comprising an electron transport layer provided between said hole blocking layer and said electron injection electrode, said hole blocking layer having greater ionization potential than that of said electron transport layer.

2. An organic electroluminescent device, comprising in the following order:

a hole injection electrode;

a luminescent layer;

a hole blocking layer; and an electron injection electrode, said hole blocking layer including a ternary complex compound which is a bis-(2-methyl-8-quinolinolato)-chloro-indium having a molecular structure represented by the following formula (3):

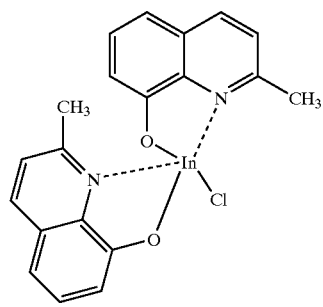

(3)

and further comprising an electron transport layer provided between said hole blocking layer and said electron injection electrode, said hole blocking layer having greater ionization potential than that of said electron transport layer.

* * * * *